(12) United States Patent
Clegg

(10) Patent No.: US 10,281,493 B1
(45) Date of Patent: May 7, 2019

(54) SIGNAL CONTROL SYSTEM FOR PERFORMING DIAGNOSTIC TESTING ON AN ELECTRICAL SYSTEM

(71) Applicant: Boyd Clegg, Vacaville, CA (US)

(72) Inventor: Boyd Clegg, Vacaville, CA (US)

( * ) Notice: Subject to any disclaimer, the term of this patent is extended or adjusted under 35 U.S.C. 154(b) by 193 days.

(21) Appl. No.: 15/465,576

(22) Filed: Mar. 21, 2017

Related U.S. Application Data

(60) Provisional application No. 62/311,273, filed on Mar. 21, 2016.

(51) Int. Cl.
*G01R 1/20* (2006.01)
*G01R 1/02* (2006.01)

(52) U.S. Cl.
CPC ............. *G01R 1/206* (2013.01); *G01R 1/02* (2013.01)

(58) Field of Classification Search
CPC ........... G01R 1/20; G01R 1/203; G01R 1/206
See application file for complete search history.

(56) References Cited

U.S. PATENT DOCUMENTS

| 2,039,905 | A | * | 5/1936 | Hoover | H04B 17/10 |
| | | | | | 324/408 |
| 2,096,131 | A | * | 10/1937 | Oestermeyer | G01R 31/006 |
| | | | | | 116/320 |
| 2,221,556 | A | * | 11/1940 | Roemisch | H04B 17/10 |
| | | | | | 324/114 |
| 2,697,203 | A | * | 12/1954 | Shepard | G01R 27/02 |
| | | | | | 324/649 |
| 3,638,108 | A | * | 1/1972 | Channing | G01R 31/006 |
| | | | | | 324/429 |
| 4,070,624 | A | * | 1/1978 | Taylor | G01R 31/006 |
| | | | | | 269/217 |
| 4,825,392 | A | * | 4/1989 | Freeman | G01R 13/02 |
| | | | | | 324/142 |
| 5,124,919 | A | * | 6/1992 | Kastelle | G01M 13/00 |
| | | | | | 324/542 |

* cited by examiner

*Primary Examiner* — Walter L Lindsay, Jr.
*Assistant Examiner* — Milton Gonzalez
(74) *Attorney, Agent, or Firm* — Law Office of Michael O'Brien

(57) ABSTRACT

A signal control system is configured to perform diagnostic testing on an electrical system. The signal control system includes a first control switch electrically coupled to a second control switch. A first multimeter lead terminal and a second multimeter lead terminal are electrically coupled to the first control switch and the second control switch. A battery is electrically coupled to the first control switch and the second control switch. A control system is electrically coupled to the first control switch, the second control switch, the first multimeter lead terminal, the second multimeter lead terminal, and the battery and configured to perform the diagnostic testing on the electrical system.

2 Claims, 16 Drawing Sheets

SIGNAL CONTROL SYSTEM FOR PERFORMING DIAGNOSTIC TESTING ON AN ELECTRICAL SYSTEM

RELATED APPLICATION

This application claims priority to provisional patent application U.S. Ser. No. 62/311,273 filed on Mar. 21, 2016, the entire contents of which is herein incorporated by reference.

BACKGROUND

The embodiments herein relate generally to systems for electric diagnosis and testing.

Prior to embodiments of the disclosed invention it was difficult to test large electrical systems for a variety of problems from a single location. Embodiments of the disclosed invention solve this problem.

SUMMARY

A signal control system is configured to perform diagnostic testing on an electrical system. The signal control system includes a first control switch electrically coupled to a second control switch. A first multimeter lead terminal and a second multimeter lead terminal are electrically coupled to the first control switch and the second control switch. A battery is electrically coupled to the first control switch and the second control switch. A control system is electrically coupled to the first control switch, the second control switch, the first multimeter lead terminal, the second multimeter lead terminal, and the battery and configured to perform the diagnostic testing on the electrical system.

In some embodiments, the first control switch can further comprise a first control switch first terminal first end, a first control switch second terminal first end, a first control switch third terminal first end, a first control switch fourth terminal first end, a first control switch first terminal second end, a first control switch second terminal second end, a first control switch third terminal second end, and a first control switch fourth terminal second end.

In some embodiments, the second control switch can further comprise a second control switch first terminal first end, a second control switch second terminal first end, a second control switch third terminal first end, a second control switch fourth terminal first end, a second control switch first terminal second end, a second control switch second terminal second end, a second control switch third terminal second end, and a second control switch fourth terminal second end.

In some embodiments, a first upper circuit first path can travel from a first upper signal input socket to the first control switch first terminal first end.

In some embodiments, a second upper circuit first path that can travel from a second upper signal input socket to the first control switch second terminal first end.

In some embodiments, a third upper circuit first path that can travel from a third upper signal input socket to the first control switch third terminal first end.

In some embodiments, a fourth upper circuit first path that can travel from a fourth upper signal input socket to the first control switch fourth terminal first end.

In some embodiments, a first lower circuit first path that can travel from a first lower signal input socket to the second control switch first terminal first end.

In some embodiments, a second lower circuit first path that can travel from a second lower signal input socket to the second control switch second terminal first end.

In some embodiments, a third lower circuit first path that can travel from a third lower signal input socket to the second control switch third terminal first end.

In some embodiments, a fourth lower circuit first path that can travel from a fourth lower signal input socket to the second control switch fourth terminal first end.

In some embodiments, the first control switch can further comprise a first control switch first pole and a first control switch negative pole. The second control switch can further comprise a second control switch first pole and a second control switch negative pole. A meter polarity switch can connect the first control switch to the second control switch. The meter polarity switch can further include a first common terminal electrically coupled to the first control switch negative pole, a first battery lower terminal, and a first battery higher terminal and a second common terminal electrically coupled to the second control switch negative pole, a second battery lower terminal, and a second battery higher terminal.

The first battery higher terminal can be electrically coupled to the second battery lower terminal and to the first multimeter lead terminal. The first battery lower terminal can be electrically coupled to the second multimeter lead terminal and to a second ground with a fuse.

In some embodiments, the battery can further comprise a battery positive terminal and a battery negative terminal. The battery positive terminal can be electrically coupled to the first control switch first pole and the second control switch positive pole. The battery negative terminal can be electrically coupled to the first upper light emitting diode, the second upper light emitting diode, the third upper light emitting diode, the fourth upper light emitting diode, the first lower light emitting diode, the second lower light emitting diode, the third lower light emitting diode, and the fourth lower light emitting diode.

BRIEF DESCRIPTION OF THE FIGURES

The detailed description of some embodiments of the invention is made below with reference to the accompanying figures, wherein like numerals represent corresponding parts of the figures.

DETAILED DESCRIPTION OF CERTAIN EMBODIMENTS

Figure 1:
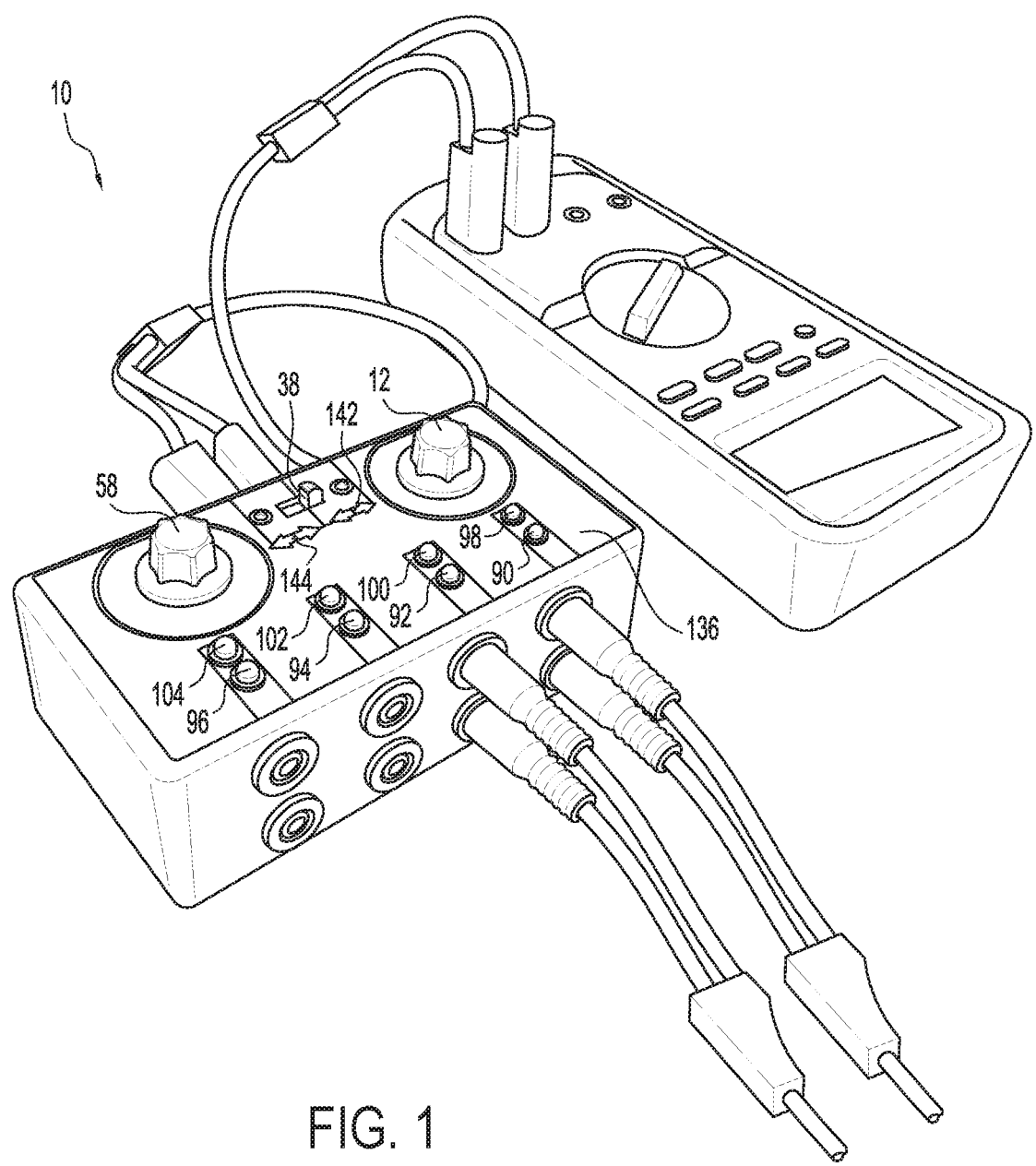
FIG. 1 shows a perspective view of one embodiment of the present invention.
Figure 2:
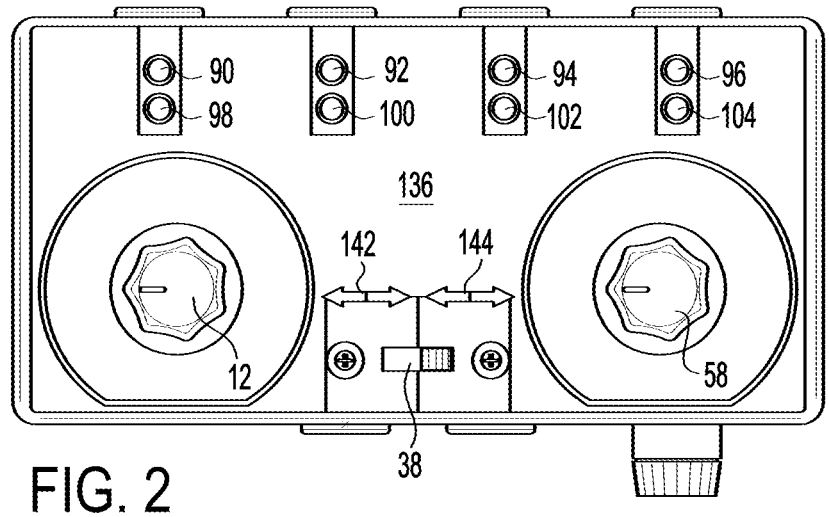
FIG. 2 shows a top view of one embodiment of the present invention.
Figure 3:
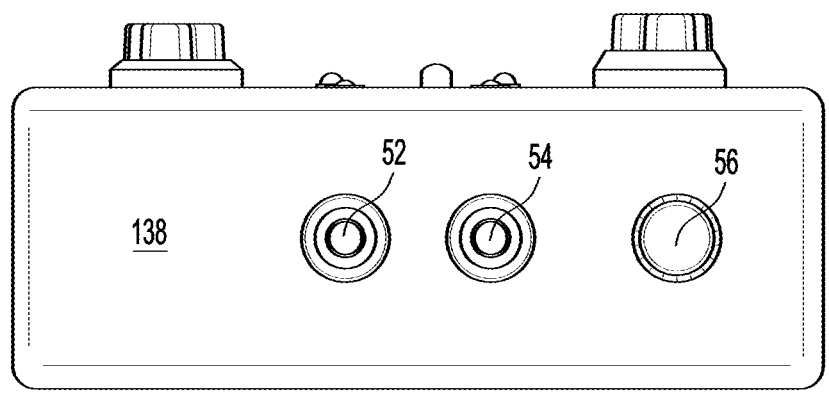
FIG. 3 shows a front view of one embodiment of the present invention.
Figure 4:
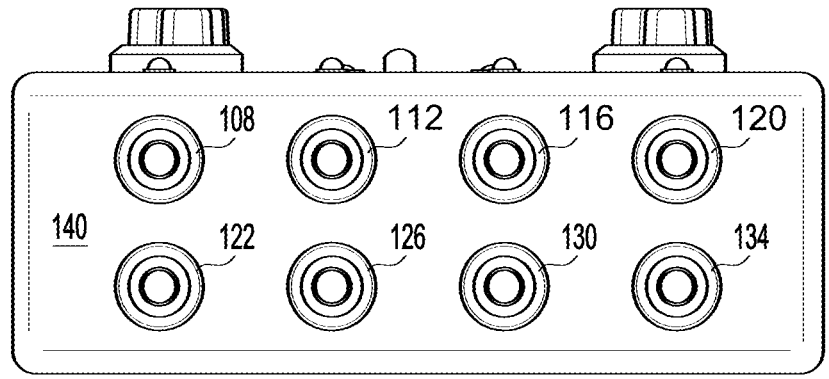
FIG. 4 shows a rear view of one embodiment of the present invention.
Figure 5:
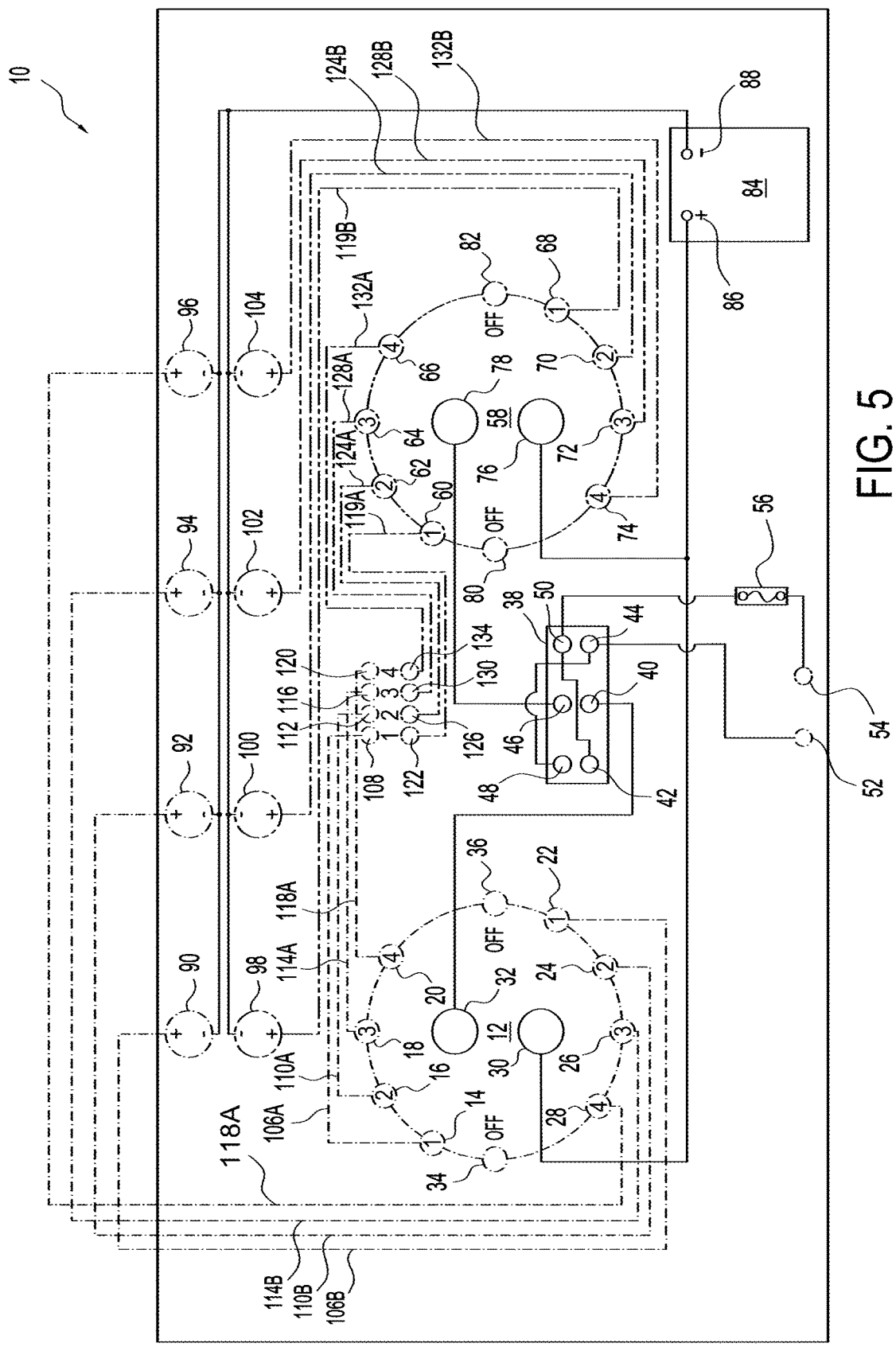
FIG. 5 shows a schematic of one embodiment of the present invention.

By way of example, and referring to FIGS. 1-5, one embodiment of the signal control system 10 further comprises a first control switch 12. The first control switch 12 is a double pole multiple throw switch. The first control switch 12 further comprises a first control switch first terminal first end 14, a first control switch second terminal first end 16, a first control switch third terminal first end 18, a first control switch fourth terminal first end 20, a first control switch first terminal second end 22, a first control switch second terminal second end 24, a first control switch third terminal second end 26, and a first control switch fourth terminal second end 28. The first control switch 12 further comprises a first control switch first pole 30 and a first control switch second pole 32. The first control switch 12 further comprises a first control switch first off terminal 34 and a first control switch first second off terminal 36.

The first control switch second pole 32 is electrically coupled to a meter polarity switch 38. Meter polarity switch 38 is a double pole double throw switch that further comprises a first common terminal 40 electrically coupled to the first control switch second pole 32, a first control switch first terminal 42, and a first control switch second terminal 44.

A meter polarity switch 38 further comprises a second common terminal 46 joined to a second control switch first terminal 48 and a second control switch second terminal 50. The first control switch second terminal 44 is electrically coupled to the second control switch first terminal 48 and to a first multimeter lead terminal 52. The first control switch first terminal 42 is electrically coupled to the second control switch second terminal 50 and to a second multimeter lead terminal 54 with a fuse 56.

The signal control system 10 further comprises a second control switch 58. The second control switch 58 is a double pole multiple throw switch. The second control switch 58 further comprises a second control switch first terminal first end 60, a second control switch second terminal first end 62, a second control switch third terminal first end 64, a second control switch fourth terminal first end 66, a second control switch first terminal second end 68, a second control switch second terminal second end 70, a second control switch third terminal second end 72, and a second control switch fourth terminal second end 74. The second control switch 58 further comprises a second control switch first pole 76 and a second control switch second pole 78. The second control switch 58 further comprises a second control switch first off terminal 80 and a second control switch first second off terminal 82.

A battery 84 further comprises a battery positive terminal 86 and a battery negative terminal 88. The battery positive terminal 86 is electrically coupled to the first control switch first pole 30 and the second control switch first pole 76. The battery negative terminal is electrically coupled to a first upper light emitting diode 90, a second upper light emitting diode 92, a third upper light emitting diode 94, a fourth upper light emitting diode 96, a first lower light emitting diode 98, a second lower light emitting diode 100, a third lower light emitting diode 102, a fourth lower light emitting diode 104.

A first upper circuit first path 106A travels from a first upper signal input socket 108 to the first control switch first terminal first end 14. The first upper circuit first path 106A continues in a first control switch first position through the first control switch second pole 32 to the first common terminal 40.

A first upper circuit second path 106B travels from the first control switch first pole 30 through the first control switch first terminal second end 22 to the first upper light emitting diode 90.

A second upper circuit first path 110A travels from a second upper signal input socket 112 to the first control switch second terminal first end 16. The second upper circuit first path 110A continues in a first control switch second position through the first control switch second pole 32 to the first common terminal 40.

A second upper circuit second path 110B travels from the first control switch first pole 30 through the first control switch second terminal second end 24 to the second upper light emitting diode 92.

A third upper circuit first path 114A travels from a third upper signal input socket 116 to the first control switch third terminal first end 18. The third upper circuit first path 114A continues in a first control switch third position through the first control switch second pole 32 to the first common terminal 40.

A third upper circuit second path 114B travels from the first control switch first pole 30 through the from the first control switch third terminal second end 26 to the third upper light emitting diode 94.

A fourth upper circuit first path 118A travels from a fourth upper signal input socket 120 to the first control switch fourth terminal first end 20. The fourth upper circuit first path 118A continues in a first control switch fourth position through the first control switch second pole 32 to the first common terminal 40.

A fourth upper circuit second path 118B travels from the first control switch first pole 30 through the first control switch fourth terminal second end 28 to the fourth upper light emitting diode 96.

A first lower circuit first path 119A travels from a first lower signal input socket 122 to the second control switch first terminal first end 60. The first lower circuit first path 119A continues in a second control switch first position through the second control switch second pole 78 to the second common terminal 46.

A first lower circuit second path 119B travels from the second control switch first pole 76 through the second control switch first terminal second end 68 to the first lower light emitting diode 98.

A second lower circuit first path 124A travels from a second lower signal input socket 126 to the second control switch second terminal first end 62. The second lower circuit first path 124A continues in a second control switch second position through the second control switch second pole 78 to the second common terminal 46.

A second lower circuit second path 124B travels from the second control switch first pole 76 through the second control switch second terminal second end 70 to the second lower light emitting diode 100.

A third lower circuit first path 128A travels from a third lower signal input socket 130 to the second control switch third terminal first end 64. The third lower circuit first path 128A continues in a second control switch third position through the second control switch second pole 78 to the second common terminal 46.

The third lower circuit second path 128B travels from the second control switch first pole 76 through the second control switch third terminal second end 72 to the third lower light emitting diode 102.

A fourth lower circuit first path 132A travels from a fourth lower signal input socket 134 to the second control switch fourth terminal first end 66. The fourth lower circuit first path 132A continues in a second control switch fourth position through the second control switch second pole 78 to the second common terminal 46.

A fourth lower circuit second path 132B travels from the second control switch fourth terminal second end 74 to the fourth lower light emitting diode 104.

In one embodiment, the signal control system 10 is a modified parallelepiped having a top side 136, a front side 138, and a rear side 140. The top side 136 is mechanically coupled to the first control switch 12, the meter polarity switch 38, and the second control switch 58. The top side 136 is further mechanically coupled to the first upper light emitting diode 90, the second upper light emitting diode 92, the third upper light emitting diode 94, the fourth upper light emitting diode 96, the first lower light emitting diode 98, the second lower light emitting diode 100, the third lower light emitting diode 102, the fourth lower light emitting diode 104.

In some embodiments, it is useful for the first upper light emitting diode 90, the second upper light emitting diode 92, the third upper light emitting diode 94, and the fourth upper light emitting diode 96 to be a first color such as red. Additionally, it can be helpful for the first control switch 12 to be the first color as well. In some embodiments, it can be helpful for the first lower light emitting diode 98, the second lower light emitting diode 100, the third lower light emitting diode 102, the fourth lower light emitting diode 104 to be a second color such as green. Additionally, it can be helpful for the second control switch 58 to be the second color as well.

It follows that meter polarity switch 38 can be used to indicate the orientation of its double pole double throw arrangement. A first indicator arrow 142 can indicate a first orientation toward the first control switch 12. Likewise, a second indicator arrow 144 can indicate a second orientation toward the second control switch 58.

Figure 6:
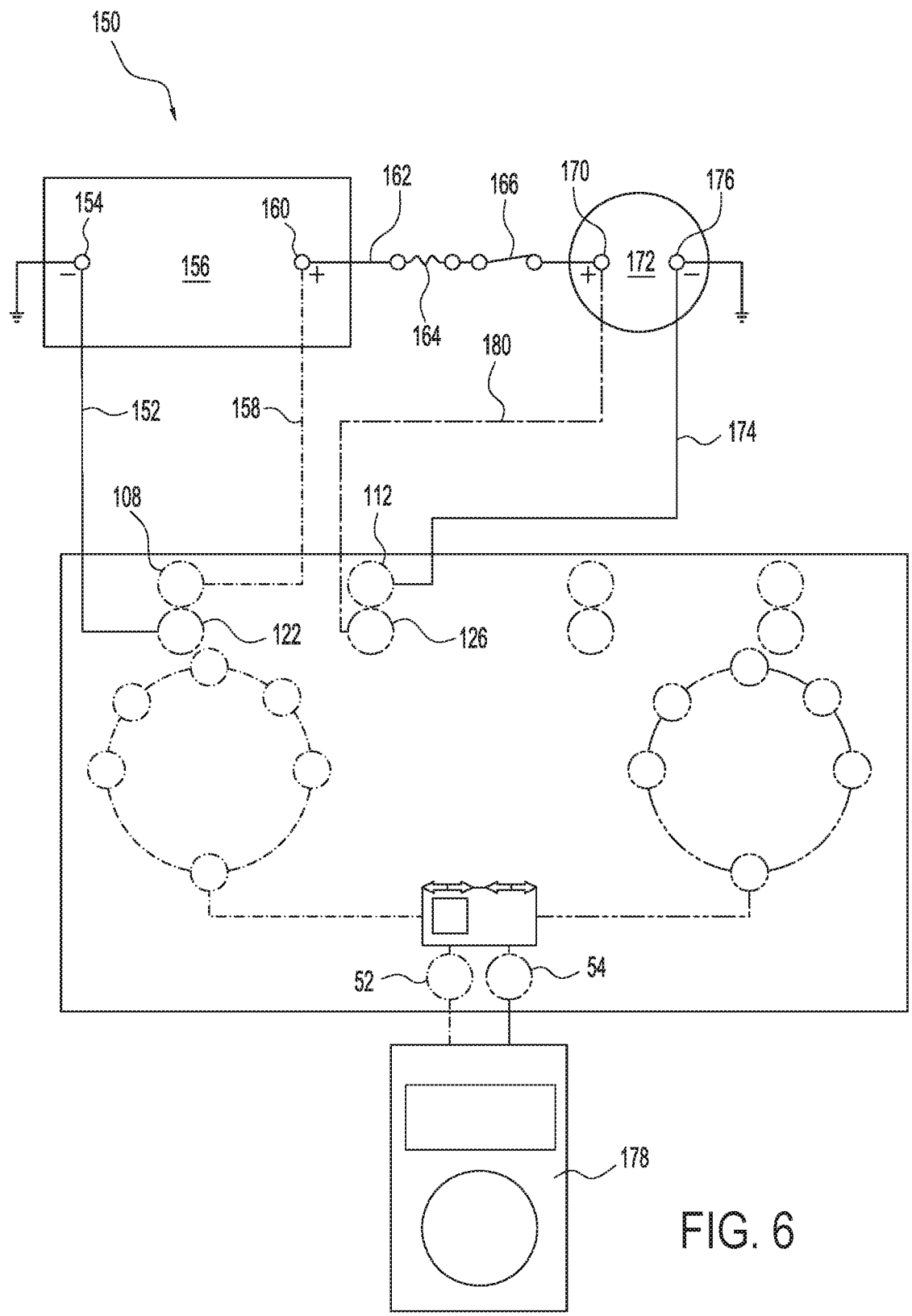
FIG. 6 shows a schematic of one embodiment of the present invention, shown in use.

Turning to FIG. 6, a direct reading voltage drop test 150 is demonstrated. This test is useful for any load such as charging or starting issues, dim light issues, fuel pump issues, electric window issues, and so on. Any time the load and the source voltage are not conveniently located and or the technician is working alone this test can be performed.

First, connect a negative battery lead cable 152 from the first lower signal input socket 122 to a battery negative terminal 154 on a first battery 156. Next, connect a positive battery lead cable 158 from first upper signal input socket 108 to a battery positive terminal 160 on the first battery 156. After that, connect a load positive terminal 170 on a load 172 to the battery positive terminal 160 with a battery positive terminal cable 162 having a battery positive terminal cable fuse 164 and a battery positive terminal cable switch 166. Following that, connect a load positive lead cable 180 from the load positive terminal to the second lower signal input socket 126. Then, connect a load negative lead cable 174 to a load negative terminal 176 and to the second upper signal input socket 112. Next, connect the first multimeter lead terminal 52 and the second multimeter lead terminal 54 to a multimeter 178.

To obtain a source voltage, put the first control switch 12 in a first control switch first position aligned with the first control switch first terminal first end 14 and the first control switch first terminal second end 22. Then, put the second control switch 58 in a second control switch first position aligned with the second control switch first terminal first end 60 and the second control switch first terminal second end 68. When the meter polarity switch 38 is in the first orientation, then the multimeter 178 provides the source voltage.

To obtain the load voltage, put the first control switch 12 in a first control switch second position aligned with the first control switch second terminal first end 16 and the first control switch second terminal second end 24. Then, put the second control switch 58 in a second control switch second position aligned with the second control switch second terminal first end 62 and the second control switch second terminal second end 70. When the meter polarity switch 38 is in the second orientation, then the multimeter 178 provides the load voltage.

The total voltage drop is the source voltage less the load voltage. If the total voltage drop exceeds provided parameters for the load, then the ground voltage drop and power voltage drop can be used to further diagnose errors.

To obtain the ground voltage drop, put the first control switch 12 in the second control switch second position. Then, move the second control switch 58 to the second control switch first position. The voltage on the multimeter 178 is the voltage drop on the ground side of the circuit.

To obtain the power voltage drop, put the second control switch 58 in the second control switch second position. After that, move the first control switch 12 to the first control switch first position. The voltage on the multimeter 178 is the voltage drop on the power side of the circuit.

Figure 7:
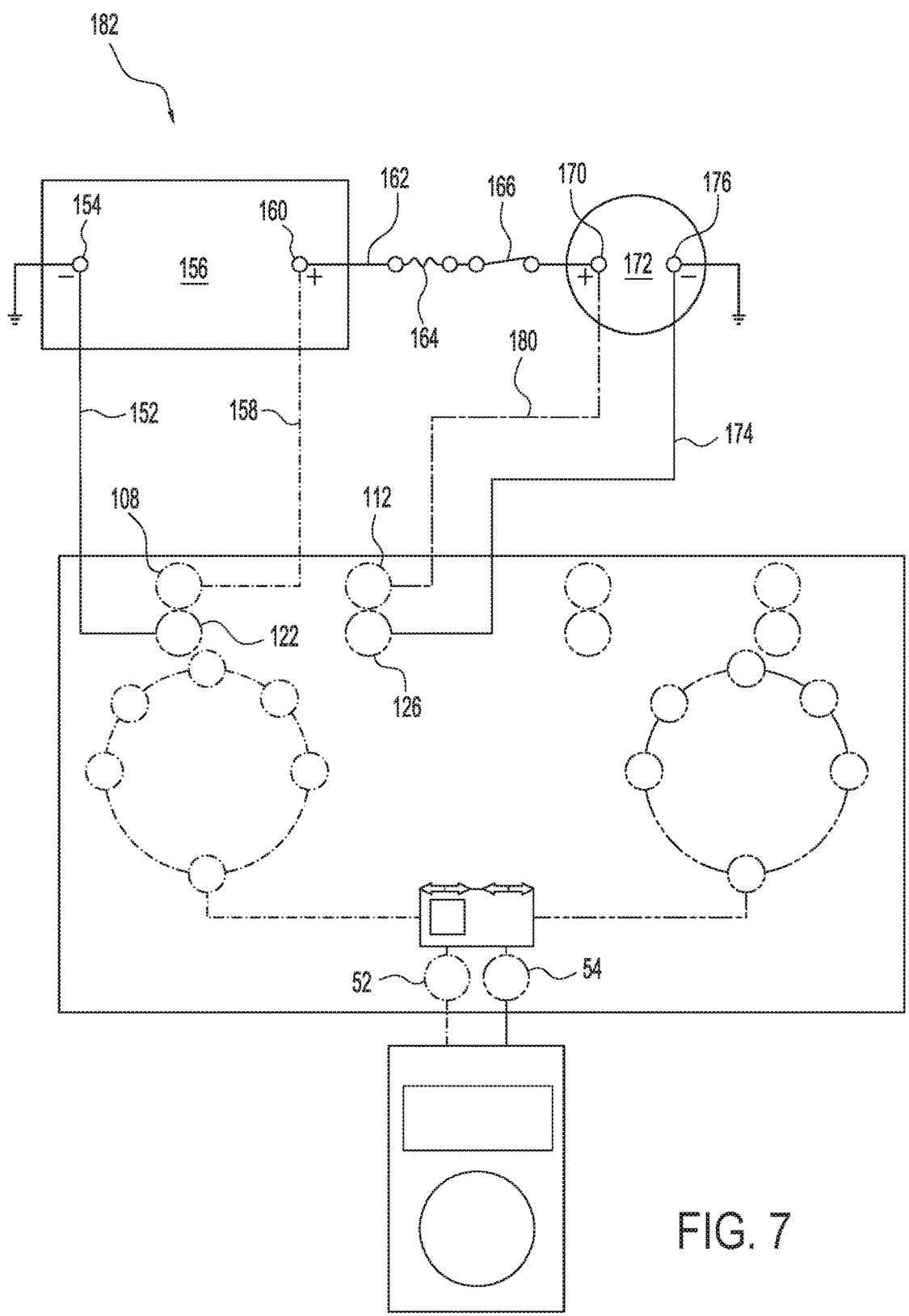
FIG. 7 shows a schematic of one embodiment of the present invention, shown in use.

Turning to FIG. 7, an isolating a point method calculated voltage drop test 182 is demonstrated. This test is most effective for locating a defective component(s) within the circuit allowing you to check multiple points of the circuit. This is similar to the direct reading voltage drop test 150 except now the load positive lead cable 180 is connected from the load positive terminal 170 to the second upper signal input socket 112. Then, the load negative lead cable 174 is connected from the load negative terminal 176 and to the to the second lower signal input socket 126. The source voltage, load voltage, ground side voltage drop and power side voltage drop are similarly determined.

Figure 8:
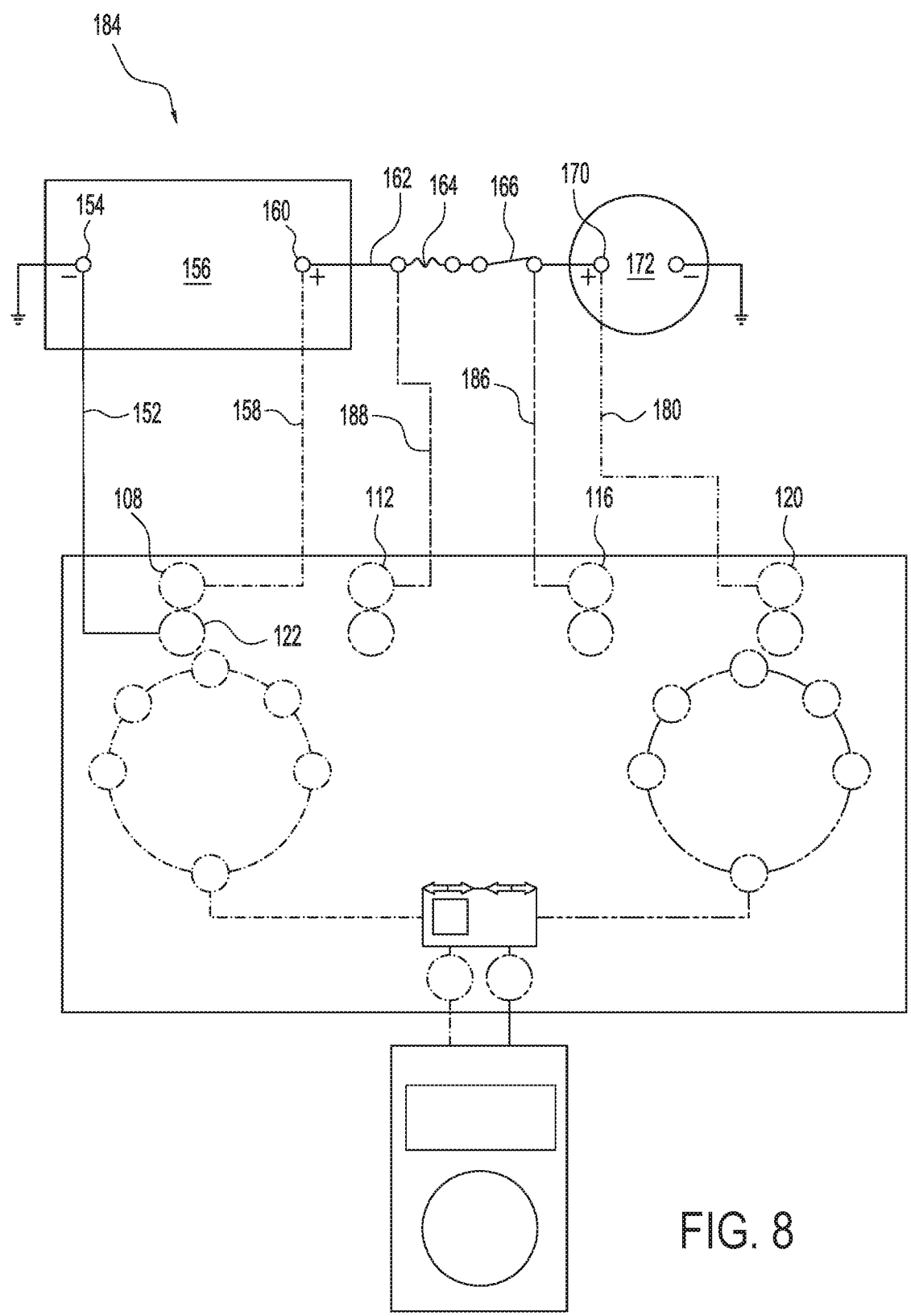
FIG. 8 shows a schematic of one embodiment of the present invention, shown in use.

FIG. 8 shows an isolating the voltage drop on the power side test 184. The arrangement is substantially similar to the isolating a point method calculated voltage drop test 182. Here, fuse cable 188 is connected to the battery positive terminal cable fuse 164 and the second upper signal input socket 112. The load positive lead cable 180 is connected from the load positive terminal 170 to the fourth upper signal input socket 120. The switch cable 186 is connected from the battery positive terminal cable switch 166 to the third upper signal input socket 116.

For the second upper signal input socket 112 the second control switch 58 is in the second control switch first position. When the first control switch 12 is in the first control switch first position the source voltage is shown. When the first control switch 12 is in the first control switch second position the fuse voltage is shown. When the first control switch 12 is in a first control switch third position joining the first control switch third terminal first end 18 and the first control switch third terminal second end 26 a switch voltage is shown. When the first control switch 12 is in a first control switch fourth position joining the first control switch fourth terminal first end 20 and the first control switch fourth terminal second end 28 the load voltage is shown. The difference between the source voltage, switch voltage, fuse voltage and load voltage can show what part of the circuit is damaged.

Figure 9:
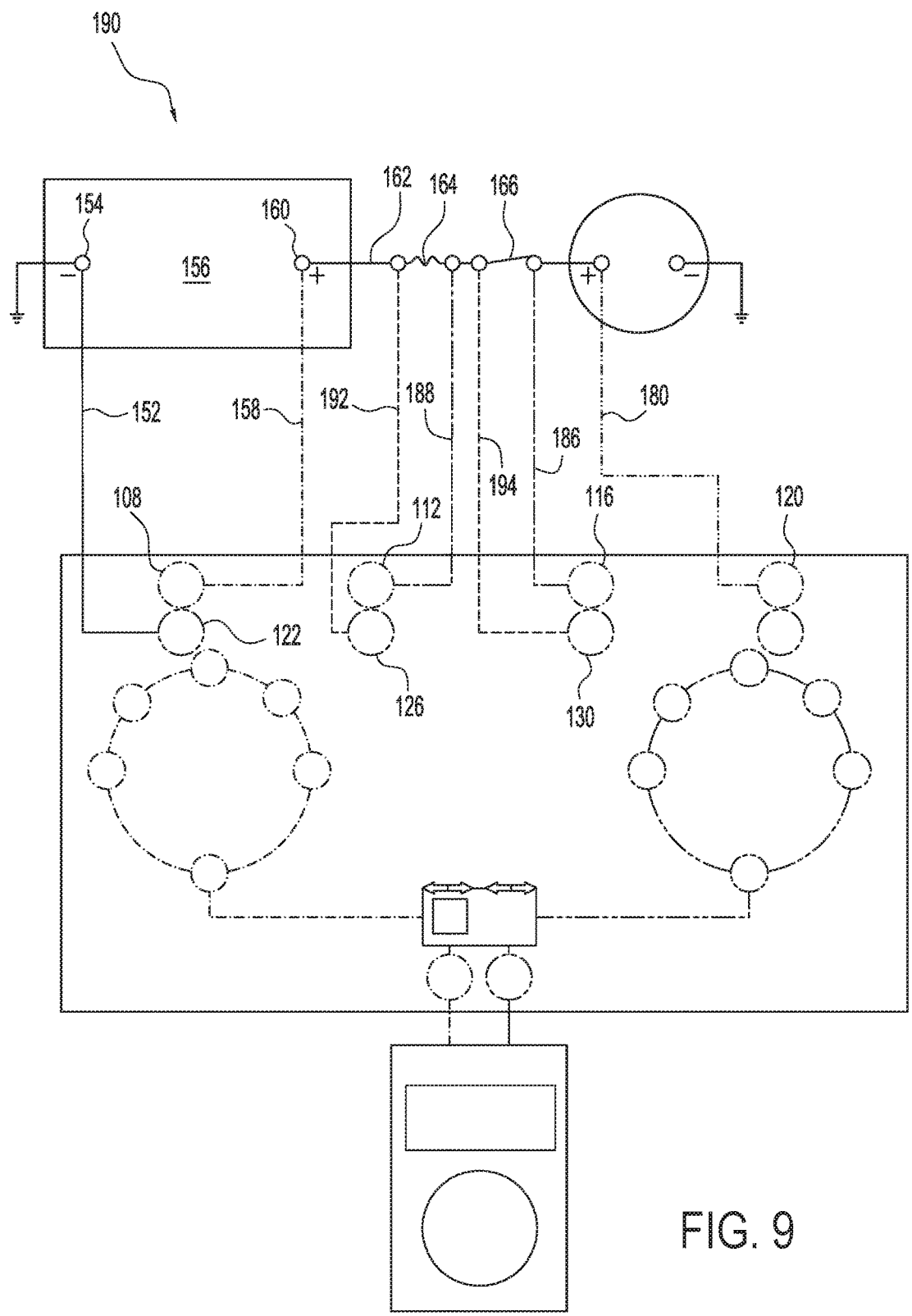
FIG. 9 shows a schematic of one embodiment of the present invention, shown in use.

FIG. 9 shows a second isolating the voltage drop on the power side test 190. The arrangement is substantially similar to the isolating the voltage drop on the power side test 184. Here, a second fuse cable 192 is connected to the battery positive terminal cable fuse 164 and the second lower signal input socket 126. A second switch cable 194 is connected to the battery positive terminal cable switch and the third lower signal input socket 130.

Under this configuration, when the first control switch 12 is in the first control switch first position and the second control switch 58 is in the second control switch second position, the actual voltage drop from the battery to the fuse panel input is shown on the multimeter 178. When the first control switch 12 is in the first control switch second position and the second control switch 58 is in the second control switch second position, then the actual voltage dropped in the fuse panel is shown on the multimeter 178. When the first control switch 12 is in a first control switch second position and the second control switch 58 is in a second control switch third position connecting the second control switch third terminal first end 64 and the second control switch third terminal second end 72, then the multimeter shows the actual voltage dropped from the battery positive terminal cable fuse 164 to the battery positive terminal cable switch 166. When the first control switch 12 is in a first control switch third position connecting the first control switch third terminal first end 18 and the first control switch third terminal second end 26 and the second control switch 58 is in a second control switch third position, then the multimeter shows the actual voltage dropped from the battery positive terminal cable switch 166 with reversed polarity.

Figure 10:
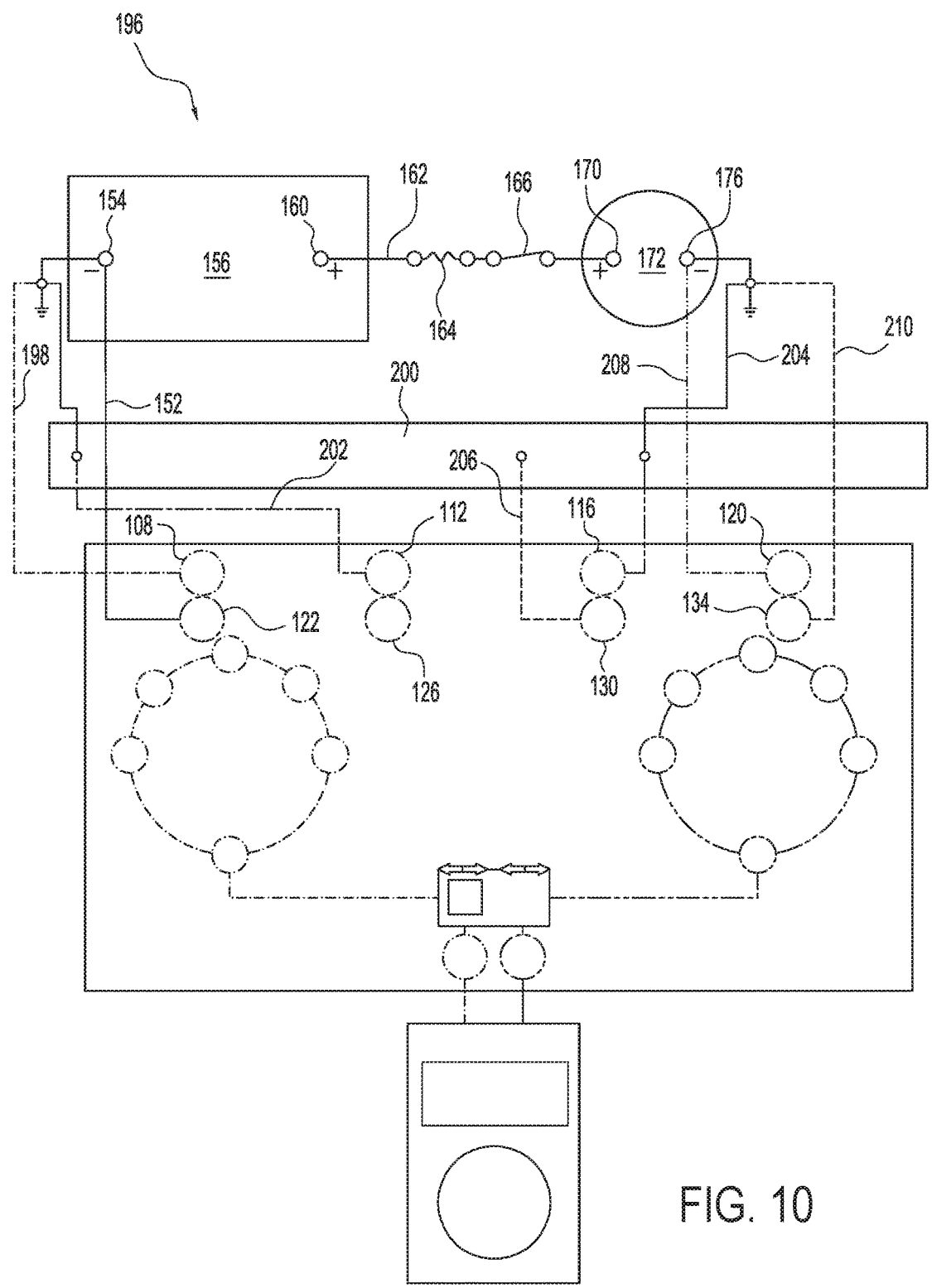
FIG. 10 shows a schematic of one embodiment of the present invention, shown in use.

FIG. 10 shows an isolating the voltage drop on the ground side test 196, which has some similar components to the configurations above. The first upper signal input socket 108 is connected to a ground with a first ground cable 198. The second upper signal input socket 112 is connected to a vehicle chassis 200 and then to the ground with a second ground cable 202. The third upper signal input socket 116 is connected to the vehicle chassis 200 and then to the ground with a third ground cable 204. The third lower signal input socket 130 is connected to the vehicle chassis 200 with a first chassis cable 206. The fourth upper signal input socket 120 is connected to the load negative terminal 176 with a first load terminal cable 208. The fourth lower signal input socket is connected to a third ground cable 204 with a fourth ground cable 210.

FIG. 10 shows the most commonly shared current path on a vehicle. Isolating the ground side voltage drop is often the most challenging test to perform. There are multiple paths the current can follow combine with multiple loads that may feed into the shared ground path.

Figure 11:
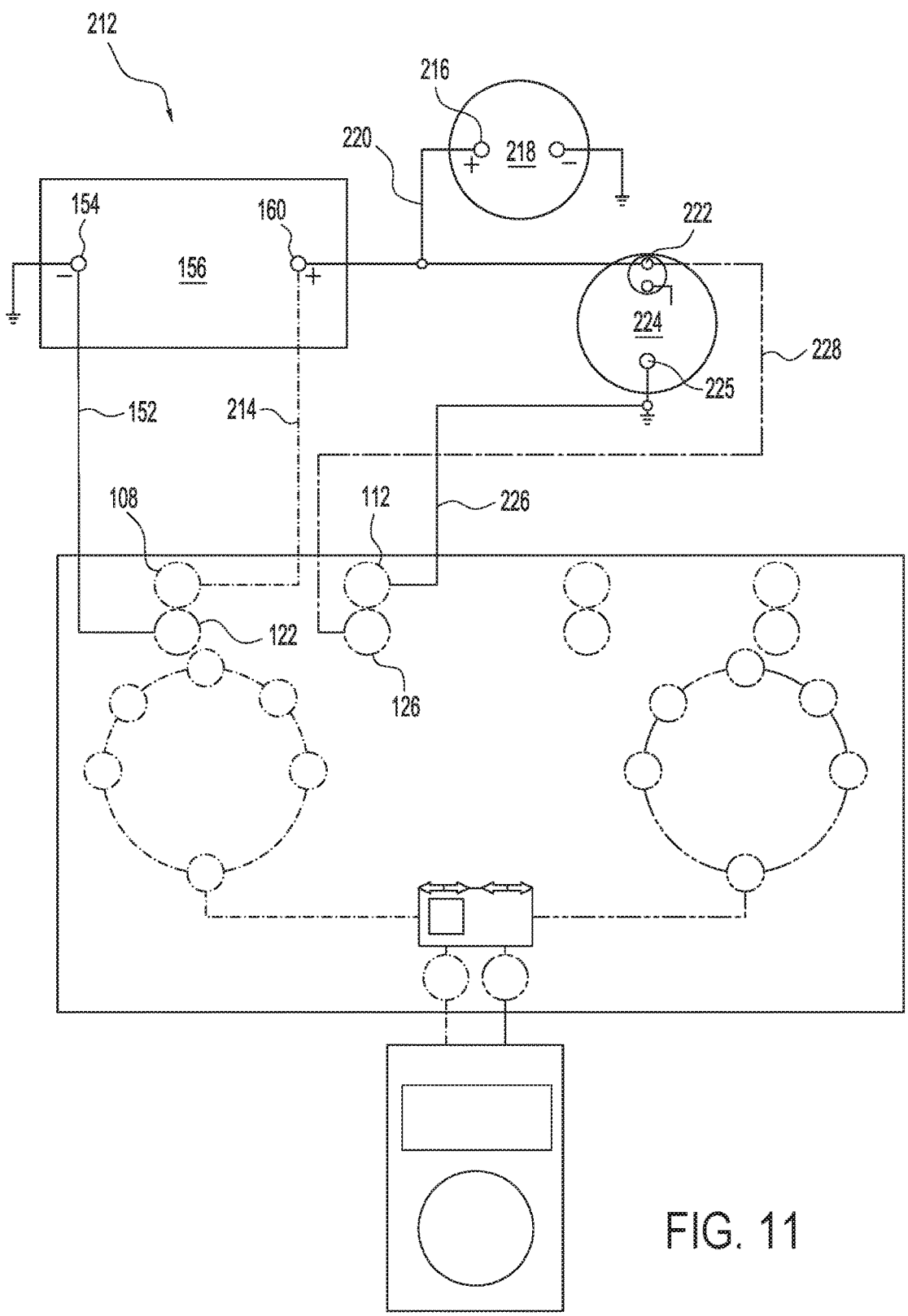
FIG. 11 shows a schematic of one embodiment of the present invention, shown in use.

FIG. 11 shows a single battery system starting test 212. Here, the battery positive terminal 160 is electrically coupled to the first upper signal input socket 108 with a positive battery terminal cable 214. The battery positive terminal 160 is further electrically coupled to an alternator positive terminal 216 on an alternator 218 with an alternator positive cable 220. The alternator positive cable 220 is further connected to a starter positive terminal 222 on a starter 224. A starter ground 225 on the starter 224 is connected to the second upper signal input socket 112 with an alternator ground cable 226. The second lower signal input socket 126 is electrically coupled to the starter positive terminal 222 with a starter positive cable 228.

To determine the cranking/charging voltage first set the multimeter 178 to min/max and start the vehicle. If the minimum voltage is greater than 9.6 Volts, then check the maximum voltage. This value will depend on vehicle specification but could be between 13.5 and 14.5 Volts.

Figure 12:
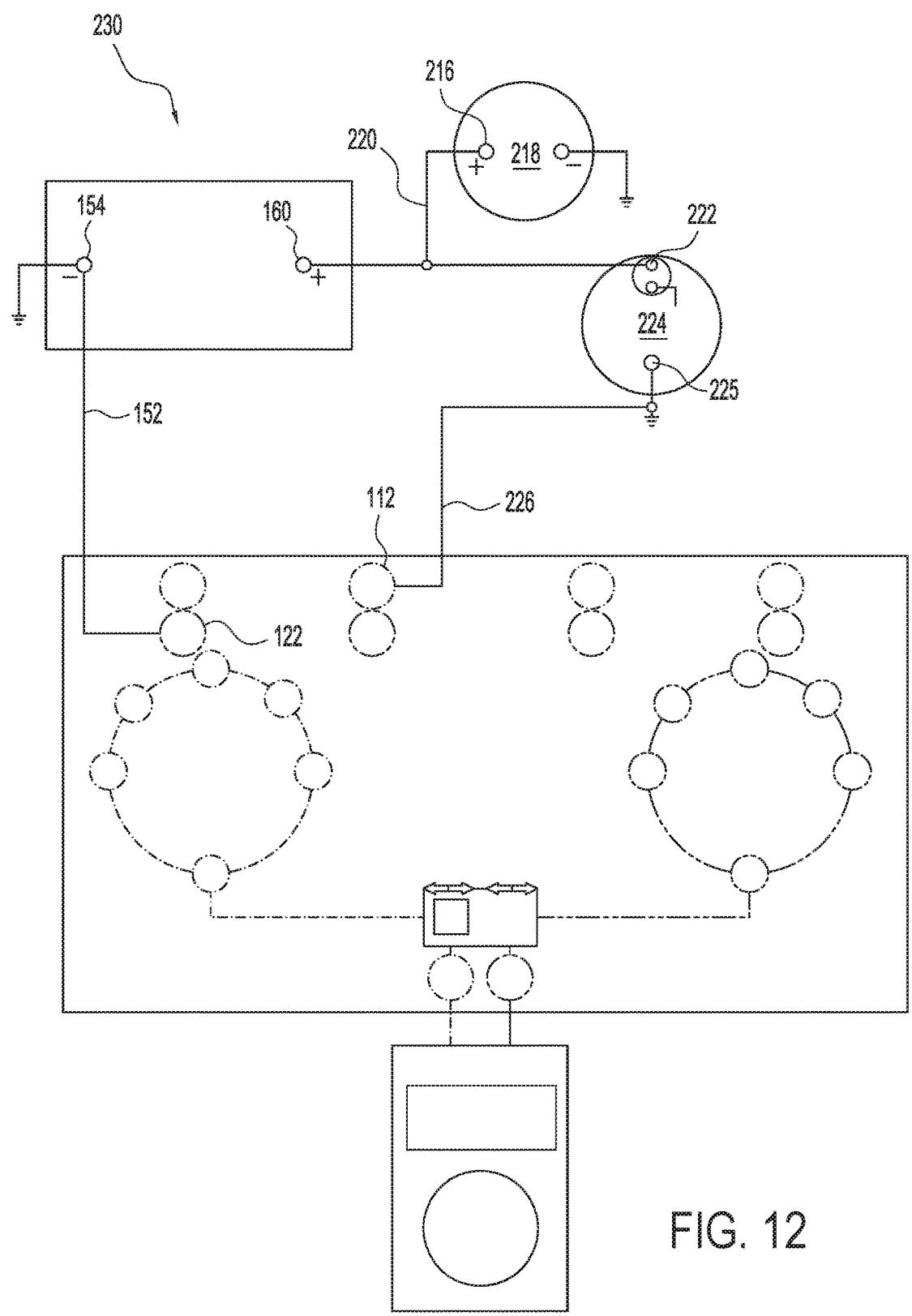
FIG. 12 shows a schematic of one embodiment of the present invention, shown in use.

FIG. 12 shows a starter ground voltage side drop test 230. To measure complete a starter ground side voltage drop set the second control switch 58 to the second control switch first position and the first control switch 12 to the first control switch first position.

Figure 13:
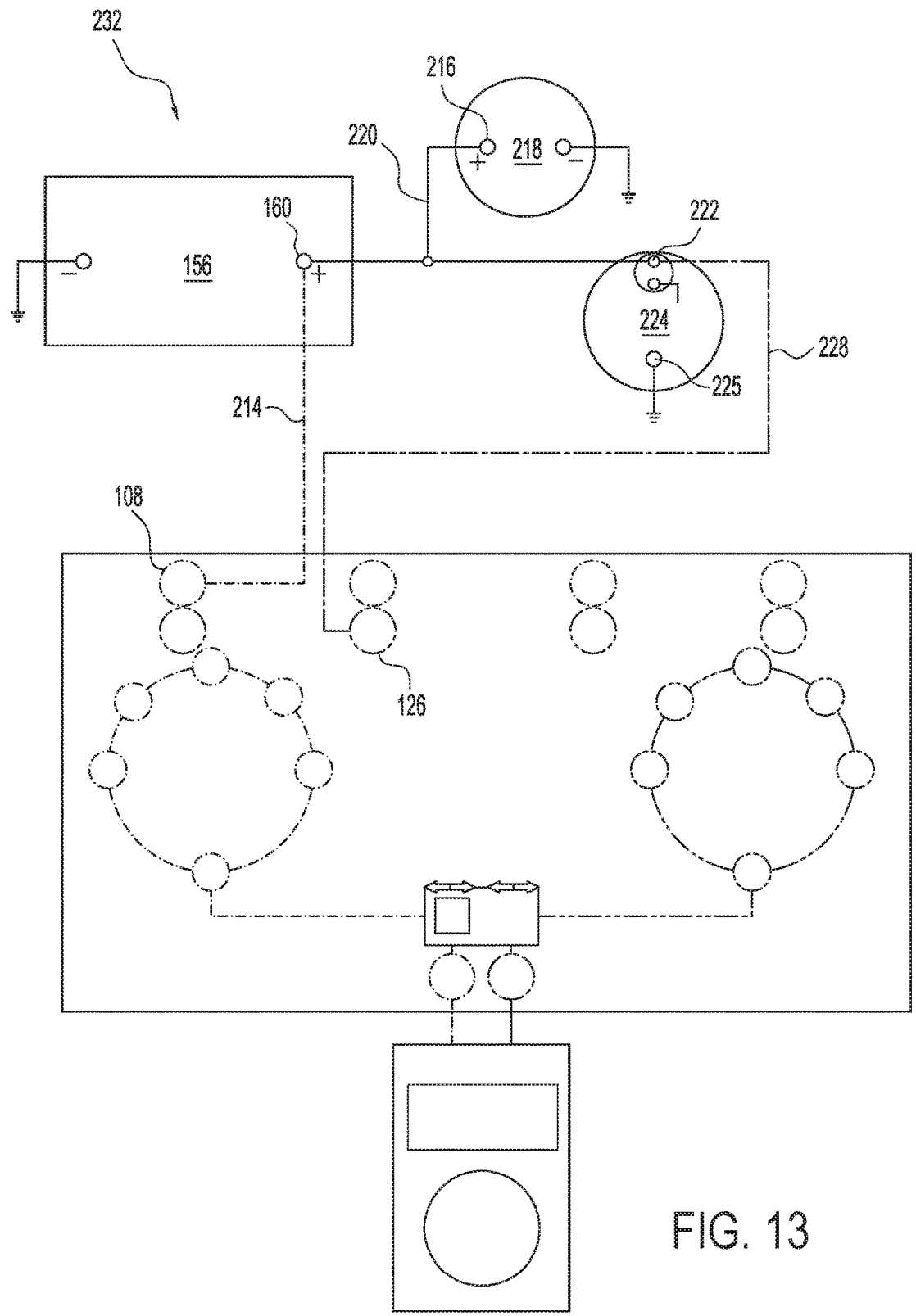
FIG. 13 shows a schematic of one embodiment of the present invention, shown in use.

FIG. 13 shows a starter power side voltage drop test 232. To measure complete a starter power side voltage drop set the second control switch 58 to the second control switch second position and the first control switch 12 to the first control switch second position.

Figure 14:
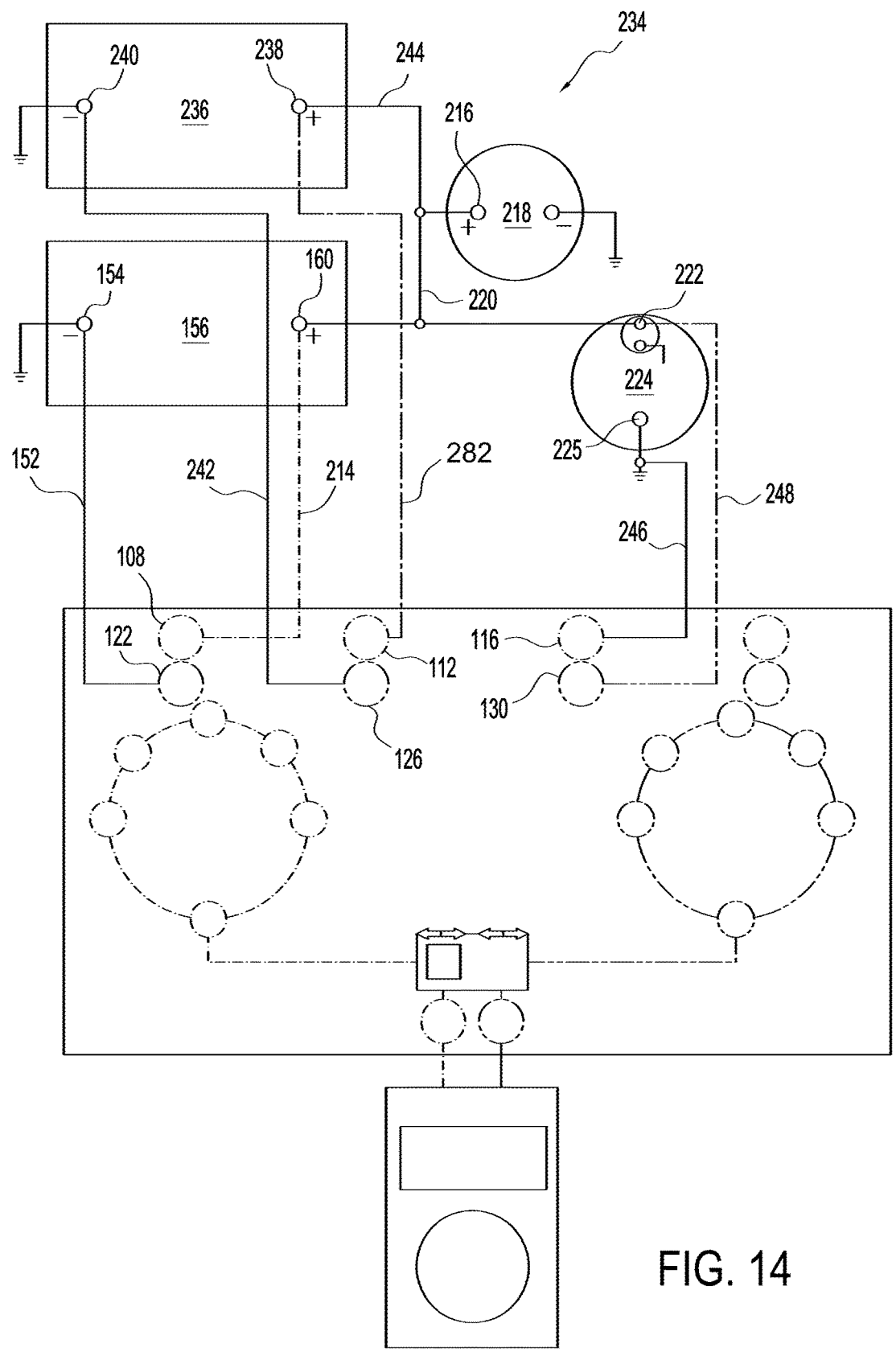
FIG. 14 shows a schematic of one embodiment of the present invention, shown in use.

FIG. 14 shows a parallel battery system starting test 234. Here, there is a second battery 236 further comprising a second battery positive lead 238 and a second battery negative lead 240. The second battery negative lead 240 is electrically coupled to the second lower signal input socket 126 with a second battery negative lead cable 242. The second battery positive lead 238 is electrically coupled to the second upper signal input socket 112 with a second battery positive lead first cable 282. The second battery positive lead 238 is electrically coupled to the alternator positive cable 220 with a second battery positive lead second cable 244. The starter ground 225 is connected to the third upper signal input socket 116 with a starter ground first cable 246. The starter positive terminal 222 is connected to the third lower signal input socket 130 with a starter positive terminal first cable 248.

Figure 15:
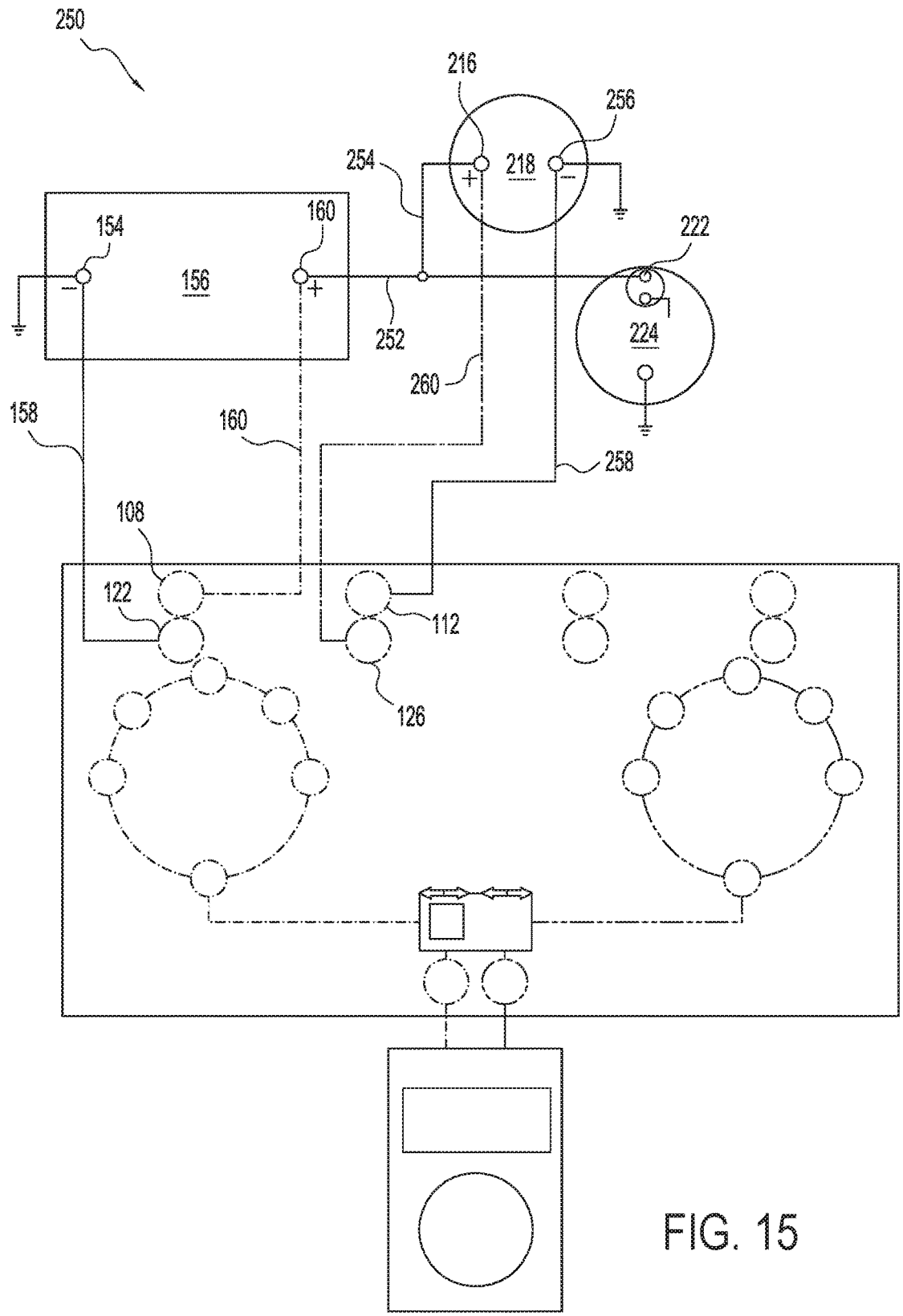
FIG. 15 shows a schematic of one embodiment of the present invention, shown in use.
Figure 16:
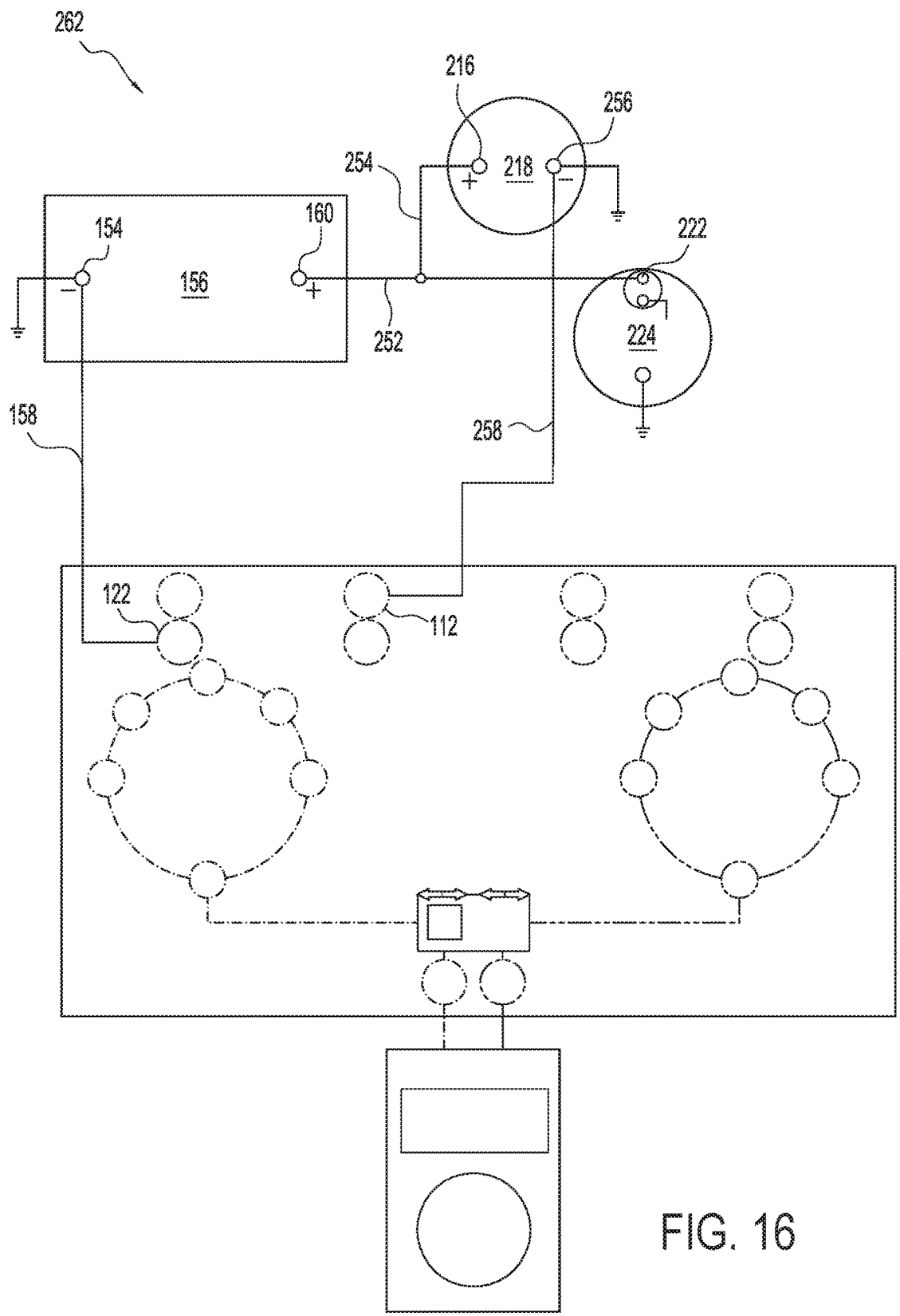
FIG. 16 shows a schematic of one embodiment of the present invention, shown in use.
Figure 17:
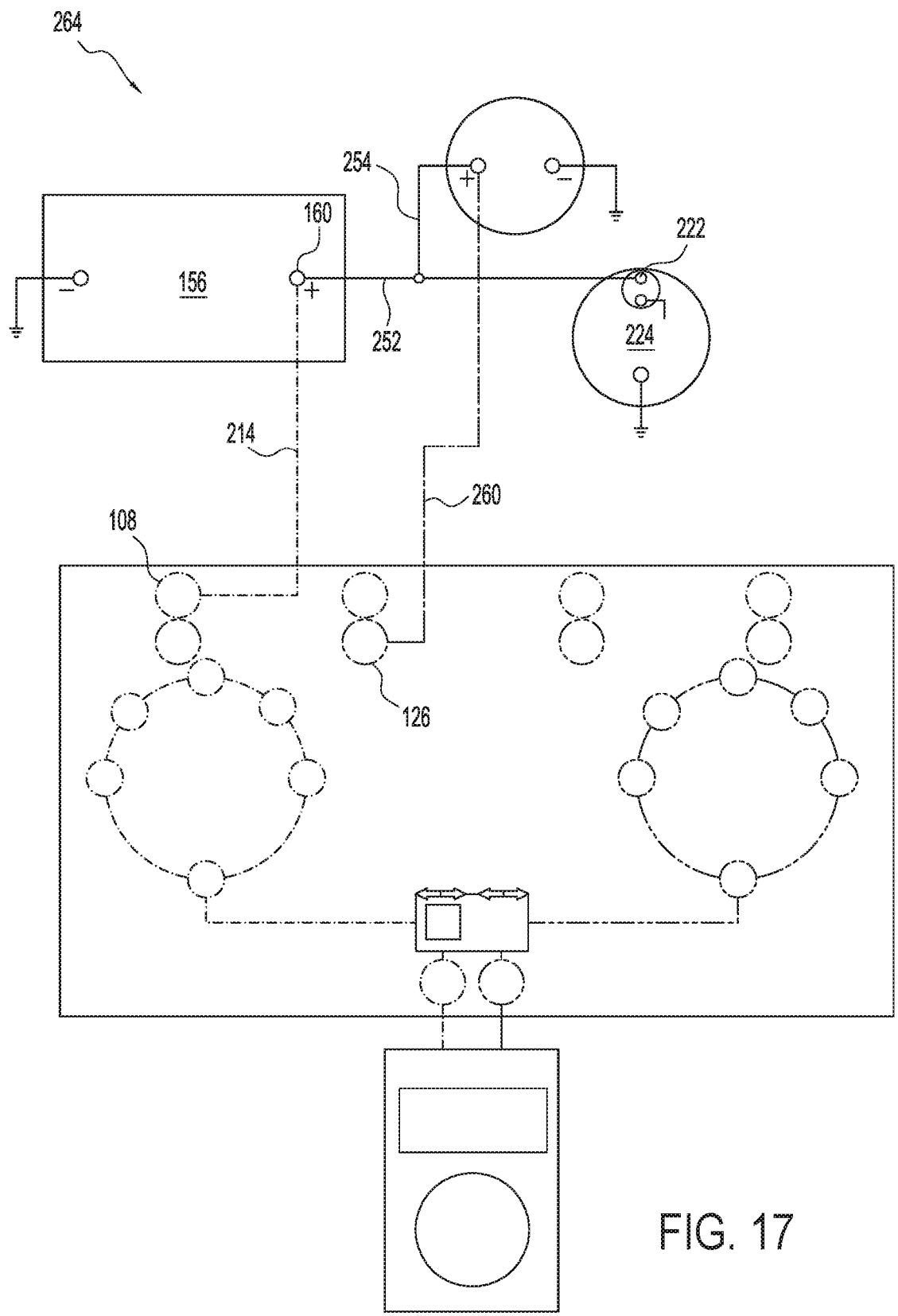
FIG. 17 shows a schematic of one embodiment of the present invention, shown in use.

FIG. 15 shows a single battery charging system test 250. Here, the battery positive terminal 160 is connected to the starter positive terminal 222 with starter positive terminal first cable 252. The alternator positive terminal 216 is connected to the starter positive terminal first cable 252 with an alternator positive terminal first cable 254. A starter negative terminal 256 on the alternator 218 is connected to the second upper signal input socket 112 with a starter negative terminal cable 258. The alternator positive terminal 216 is connected to the second lower signal input socket 126 with an alternator positive terminal second cable 260. FIG. 16 shows a complete ground side voltage drop test 262 using similar components to the single battery charging system test 250. FIG. 17 shows a complete power side voltage drop test 264 using similar components to the single battery charging system test 250.

Figure 18:
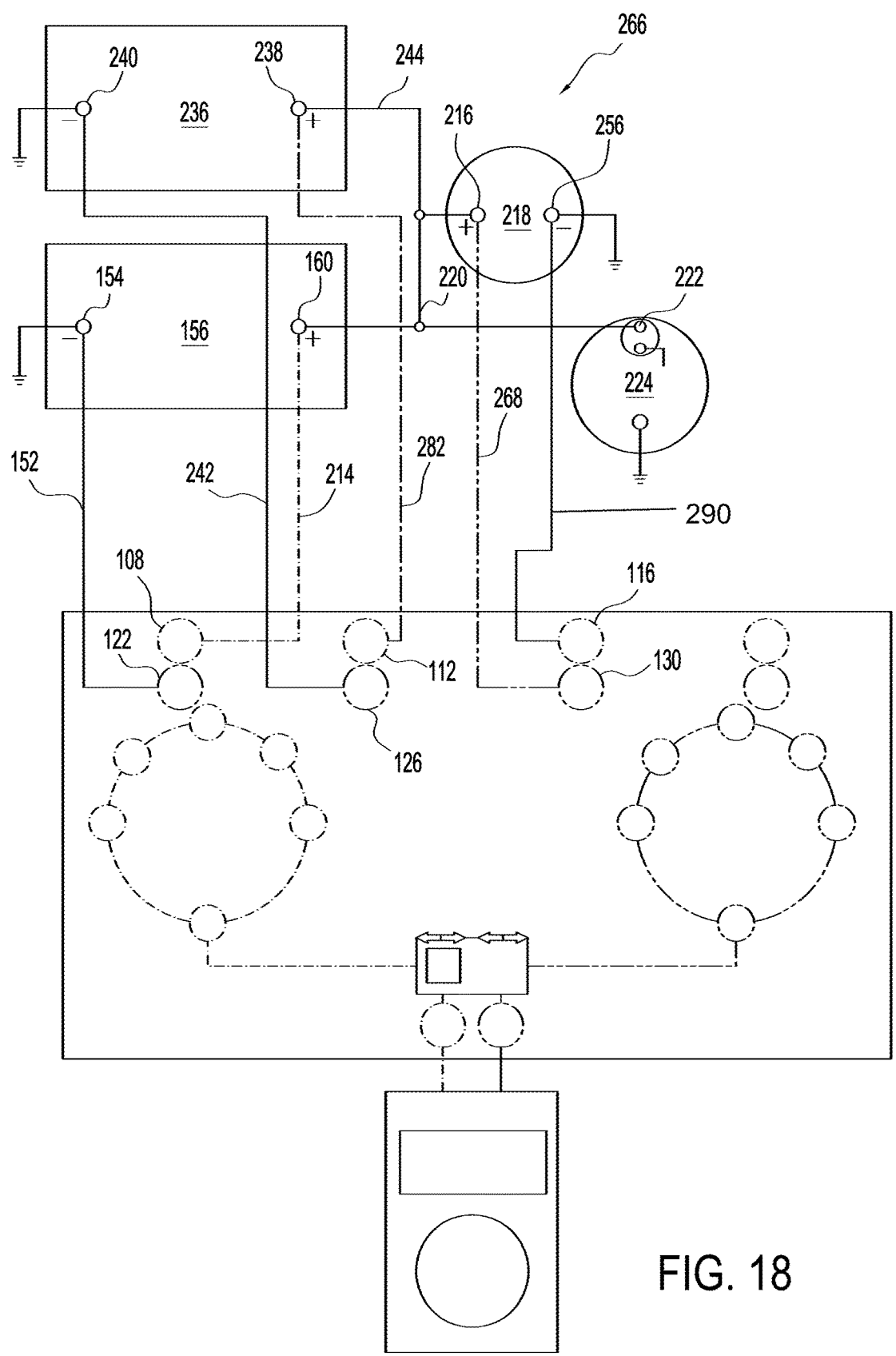
FIG. 18 shows a schematic of one embodiment of the present invention, shown in use.

FIG. 18 shows a parallel battery charging system test 266. The alternator positive terminal 216 is connected to the third lower signal input socket 130 with an alternator positive terminal cable 268. The starter negative terminal 256 is connected to the third upper signal input socket 116 with an alternator negative terminal cable 290.

As used in this application, the term "a" or "an" means "at least one" or "one or more."

As used in this application, the term "about" or "approximately" refers to a range of values within plus or minus 10% of the specified number.

As used in this application, the term "substantially" means that the actual value is within about 10% of the actual desired value, particularly within about 5% of the actual desired value and especially within about 1% of the actual desired value of any variable, element or limit set forth herein.

All references throughout this application, for example patent documents including issued or granted patents or equivalents, patent application publications, and non-patent literature documents or other source material, are hereby incorporated by reference herein in their entireties, as though individually incorporated by reference, to the extent each reference is at least partially not inconsistent with the disclosure in the present application (for example, a reference that is partially inconsistent is incorporated by reference except for the partially inconsistent portion of the reference).

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

Any element in a claim that does not explicitly state "means for" performing a specified function, or "step for" performing a specified function, is not to be interpreted as a "means" or "step" clause as specified in 35 U.S.C. § 112, ¶ 6. In particular, any use of "step of" in the claims is not intended to invoke the provision of 35 U.S.C. § 112, ¶ 6.

Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

What is claimed is:

1. A signal control system, configured to perform diagnostic testing on an electrical system; the signal control system comprising:
    a first control switch electrically coupled to a second control switch,
    wherein the first control switch further comprises a first control switch first terminal first end, a first control switch second terminal first end, a first control switch third terminal first end, a first control switch fourth terminal first end, a first control switch first terminal second end, a first control switch second terminal second end, a first control switch third terminal second end, and a first control switch fourth terminal second end; and
    wherein the second control switch further comprises a second control switch first terminal first end, a second control switch second terminal first end, a second control switch third terminal first end, a second control switch fourth terminal first end, a second control switch first terminal second end, a second control switch second terminal second end, a second control switch third terminal second end, and a second control switch fourth terminal second end;
    wherein the first control switch further comprises a first control switch first pole and a first control switch negative pole;
    wherein the second control switch further comprises a second control switch first pole and a second control switch negative pole;
    a first multimeter lead terminal and a second multimeter lead terminal electrically coupled to the first control switch and the second control switch;
    a battery, electrically coupled to the first control switch and the second control switch;
    a multimeter, electrically coupled to the first control switch, the second control switch, the first multimeter lead terminal, the second multimeter lead terminal, and the battery and configured to perform the diagnostic testing on the electrical system;
    a first upper circuit first path that travels from a first upper signal input socket to the first control switch first terminal first end;
    a second upper circuit first path that travels from a second upper signal input socket to the first control switch second terminal first end;
    a third upper circuit first path that travels from a third upper signal input socket to the first control switch third terminal first end;
    a fourth upper circuit first path that travels from a fourth upper signal input socket to the first control switch fourth terminal first end;
    a first lower circuit first path that travels from a first lower signal input socket to the second control switch first terminal first end;
    a second lower circuit first path that travels from a second lower signal input socket to the second control switch second terminal first end;
    a third lower circuit first path that travels from a third lower signal input socket to the second control switch third terminal first end;
    a fourth lower circuit first path that travels from a fourth lower signal input socket to the second control switch fourth terminal first end;
    a meter polarity switch, connecting the first control switch to the second control switch and further comprising:
    a first common terminal electrically coupled to the first control switch negative pole, a first battery lower terminal, and a first battery higher terminal;
    a second common terminal electrically coupled to the second control switch negative pole, a second battery lower terminal, and a second battery higher terminal;
    wherein, the first battery higher terminal is electrically coupled to the second battery lower terminal and to the first multimeter lead terminal; the first battery lower terminal is electrically coupled to the second multimeter lead terminal and to a second ground with a fuse.

2. The signal control system of claim 1, further comprising:
    wherein the battery further comprises a battery positive terminal and a battery negative terminal;
    wherein the battery positive terminal is electrically coupled to the first control switch first pole and the second control switch positive pole;
    wherein the battery negative terminal is electrically coupled to the first upper light emitting diode, the second upper light emitting diode, the third upper light emitting diode, the fourth upper light emitting diode, the first lower light emitting diode, the second lower light emitting diode, the third lower light emitting diode, and the fourth lower light emitting diode.

* * * * *